US007430296B2

(12) United States Patent
Spielbauer et al.

(10) Patent No.: US 7,430,296 B2
(45) Date of Patent: Sep. 30, 2008

(54) CIRCUIT ARRANGEMENT FOR REDUCING THE DYNAMIC RANGE OF AUDIO SIGNALS

(75) Inventors: Georg Spielbauer, Steinach (DE); Markus Christoph, Straubing (DE)

(73) Assignee: Harman Becker Automotive Systems GmbH, Karlsbad (DE)

(*) Notice: Subject to any disclaimer, the term of this patent is extended or adjusted under 35 U.S.C. 154(b) by 2 days.

(21) Appl. No.: 10/515,045

(22) PCT Filed: Jul. 9, 2003

(86) PCT No.: PCT/EP03/07442

§ 371 (c)(1),
(2), (4) Date: Jun. 2, 2005

(87) PCT Pub. No.: WO2004/010412

PCT Pub. Date: Jan. 29, 2004

(65) Prior Publication Data

US 2006/0245604 A1 Nov. 2, 2006

(30) Foreign Application Priority Data

Jul. 18, 2002 (DE) .............................. 102 32 645

(51) Int. Cl.
*H03G 3/00* (2006.01)
*H03G 7/00* (2006.01)
*H03G 5/00* (2006.01)
*G10L 21/00* (2006.01)

(52) U.S. Cl. ................... 381/104; 381/106; 381/107; 381/98; 704/225; 704/500; 704/503

(58) Field of Classification Search .................. 381/104, 381/106, 107, 98, 105, 312, 320, 123; 704/225, 704/500, 503; 333/14
See application file for complete search history.

(56) References Cited

U.S. PATENT DOCUMENTS

| 4,221,934 | A | | 9/1980 | Schiff ........................... 370/7 |
| 4,701,722 | A | * | 10/1987 | Dolby .......................... 333/14 |
| 5,255,324 | A | | 10/1993 | Brewer et al. ............... 381/107 |
| 6,005,953 | A | | 12/1999 | Stuhlfelner ................ 381/94.3 |
| 6,577,739 | B1 | * | 6/2003 | Hurtig et al. ................ 381/316 |
| 7,013,011 | B1 | * | 3/2006 | Weeks et al. .................. 381/98 |
| 2001/0055404 | A1 | | 12/2001 | Bisgaard ..................... 381/314 |
| 2002/0076072 | A1 | * | 6/2002 | Cornelisse .................. 381/312 |

FOREIGN PATENT DOCUMENTS

| WO | WO 99/14986 | 3/1999 |
| WO | WO 02/15395 | 2/2002 |

* cited by examiner

*Primary Examiner*—Vivian Chin
*Assistant Examiner*—Devona E. Faulk
(74) *Attorney, Agent, or Firm*—O'Shea Getz P.C.

(57) ABSTRACT

An audio system includes a first transformation device provided with an input audio signal and which transforms the input audio signal from the time domain to the frequency domain resulting in an input spectrum. The system also includes a spectral processing device, which is connected downstream from the first transformation device, that receives the input spectrum and produces from it an output spectrum with a dynamic range that is reduced from that of the input spectrum. The system further includes a second transformation device connected downstream from the spectral processing device, and provided with the output spectrum. The second transformation device transforms the output spectrum from the frequency domain to the time domain, and provides an output audio signal.

22 Claims, 2 Drawing Sheets

CIRCUIT ARRANGEMENT FOR REDUCING THE DYNAMIC RANGE OF AUDIO SIGNALS

CLAIM OF PRIORITY

This patent application claims priority to International Patent Application serial number PCT/EP2003/07442 filed on Jul. 9, 2003 and German Patent Application serial number 102 32 645.2 filed on Jul. 18, 2002.

FIELD OF THE INVENTION

The invention relates in general to audio systems and in particular to a system for reducing the dynamic range of audio signals.

RELATED ART

One problem that occurs frequently in audio systems is that the systems are driven too strongly, and this can lead to undesirable distortion and, in some circumstances, even to damage to the system. Furthermore, it may also be desirable to limit the level of transmission systems, for example, to avoid any adverse effect on the hearing of listeners. On the other hand, in an environment filled with noise, it may be desirable to emphasize relatively quiet passages above the background noise so that they can be perceived by the listener.

Irrespective of whether the goal is to emphasize low levels (for example, by a compounder) or to limit high levels (for example, by a limiter), the outcome in both cases is that the dynamic range of the audio signal is reduced, that is, the difference between the minimum and maximum levels of the audio signal is reduced. Dynamic range compression is advantageous in particular in motor vehicles since the background noise level is relatively high, which can be improved by emphasizing the low levels. Also, the power of the audio system is limited owing to the low supply voltage in motor vehicles, and this can easily lead to distortion at high levels, which can be counteracted by limiting the levels.

One problem that occurs in typical limiters or compounders is that they necessarily always adapt themselves to the highest-energy component within the audio signal, such as bass drums or snare drums, and in the process cause the known "volume pumping" effect.

To counteract this, U.S. Pat. No. 5,255,324 proposes, for example, that the audio signal be subjected to both narrowband and broadband evaluation, with the process being based initially on the narrowband audio signal and, if this does not result in a satisfactory improvement, broadband evaluation is carried out. U.S. Pat. No. 6,005,953 discloses the provision of a number of frequency bands which are evaluated individually, with the gain of the overall audio signal then being raised or lowered. Although these measures in themselves result in an improvement, it is, however, not sufficient in many cases.

What is needed is an improved system for reducing the dynamic range of audio signals.

SUMMARY OF THE INVENTION

Briefly, according to an aspect of the present invention, an audio system includes a first transformation device provided with an input audio signal and which transforms the input audio signal from the time domain to the frequency domain resulting in an input spectrum. The system also includes a spectral processing device, connected downstream from the first transformation device, which receives the input spectrum and produces from it an output spectrum with a dynamic range that is reduced from that of the input spectrum. The system further includes a second transformation device connected downstream from the spectral processing device, and provided with the output spectrum. The second transformation device transforms the output spectrum from the frequency domain to the time domain, and provides an output audio signal.

The first transformation device preferably operates using the fast Fourier transformation (FFT) method, and the second transformation device operates using the inverse fast Fourier transformation (IFFT) method. Fast Fourier transformation is characterized by a relatively good ratio of complexity to usefulness. For certain applications, a Fourier time transformation (FTT) and its inverse function may also be used, for example, instead of fast Fourier transformation.

To provide a limiter function, the spectral processing device may attenuate the amplitude in those areas of the spectrum in which the amplitude and/or the spectral range satisfy one or more conditions. One such condition may, for example, be that the amplitude is greater than the first limit value in this spectral range. This results in absolute peaks, that is, spectral lines of a specific amplitude, being attenuated, for example, such that the relevant spectral line remains below a specific amplitude (i.e., attenuation of absolute peaks).

As an alternative or as an additional condition, it is possible to provide for a signal at a specific amplitude and in a specific spectral range to not be audible. The amplitude of the overall signal can then advantageously be reduced by removing from the overall signal any spectral components which are not audible. Time and/or spectral masking in specific spectral ranges may be used, for example, as psychoacoustical effects in this context. In this case, it is advantageous to subdivide the spectrum corresponding to the frequency groups of human hearing.

Alternatively or additionally, one condition may also be that the respective amplitude is a relative maximum or one of the maxima. In this way, the relatively greatest amplitudes are attenuated in a preferred manner (attenuation of relative peaks).

Furthermore, additionally or alternatively, one condition may be given by the position of the respective spectral range in the overall spectrum. This applies in particular to relatively low or high tones since these may either be perceived only very weakly by the listener, may not be transmitted completely by the acoustic system, or may be corrupted by the room in which they are being listened to.

For dynamic compression, especially for low levels, it is possible to provide for relatively small amplitudes which are greater than a second limit value which corresponds to a specific background noise level and are less than a third limit value which is higher than the second limit value to be emphasized.

The input spectrum and possibly also the output spectrum are preferably complex, so that the phases are also taken into account in the evaluation process.

In an alternative embodiment, the first transformation device may be preceded by an advanced initiation device which supplies the input audio signal with a delay to the first transformation device, with both transformation devices as well as a processing device being activated when the input audio signal is above a specific amplitude, and with the input audio signal being passed on to the system output unchanged when it is below the specific amplitude. This allows computation complexity to be saved since overdriving or underdriving can be identified so that the dynamic compression may be activated only when it is required.

These and other objects, features and advantages of the present invention will become more apparent in light of the following detailed description of preferred embodiments thereof, as illustrated in the accompanying drawings.

DETAILED DESCRIPTION

Figure 1:
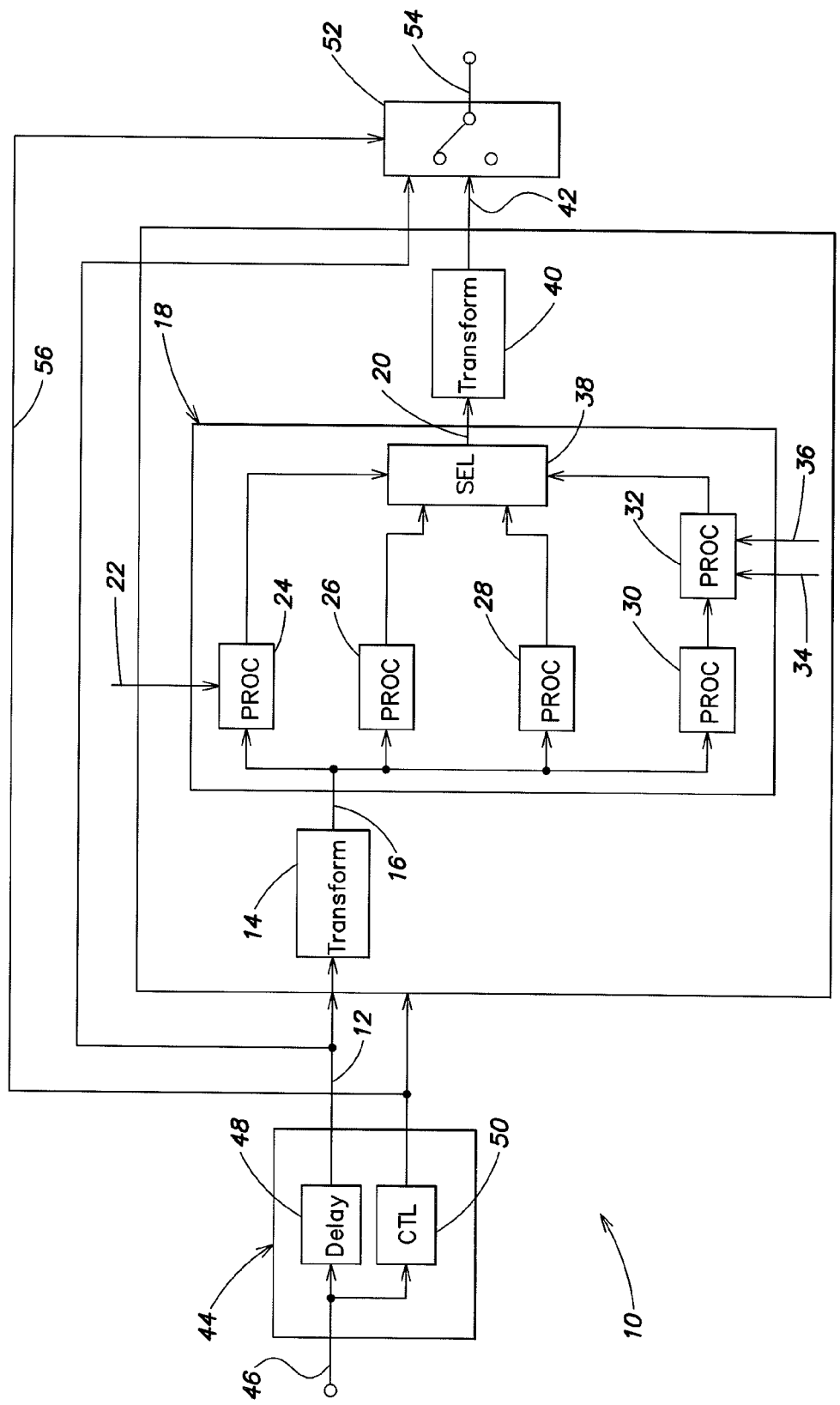
FIG. 1 illustrates an exemplary embodiment of a system according to the invention.

An exemplary embodiment of an audio system 10 according to the invention, as illustrated in FIG. 1, reduces the dynamic range of an input audio signal on a line 12. The system 10 includes a first transformation device 14 that converts the input audio signal on the line 12 to a complex input spectrum on a line 16, for example, by fast Fourier transformation (FFT).

The complex input spectrum on the line 16 is provided to a spectral processing device 18, connected downstream from the first transformation device 14. The spectral processing device 18 changes the complex input spectrum on the line 16 and provides a complex output spectrum on a line 20 whose dynamic range is reduced compared to that of the input spectrum on the line 16. The signal processing performed in the spectral processing device 18 provides for the individual spectral lines of the input spectrum on the line 16 to be evaluated, and to be compared with a first limit value provided on a line 22. A first processing unit 24 detects the spectral lines whose amplitude is greater than the first limit value on the line 22 and attenuates these spectral lines such that they are below the first limit value on the line 22.

A second processing unit 26 determines areas in the input spectrum on the line 16 whose amplitude and/or respective spectral range indicate that they are not psychoacoustically audible. These include, for example, the spectral and time masking of noise. Spectral masking means that a low-frequency tone can completely mask a somewhat higher tone at a lower level, so that the higher tone can no longer be perceived by the listener. A tone which cannot be perceived in this way is identified by the second processing unit 26 and is completely removed from the input spectrum on the line 16. For time masking, an acoustic signal at a low level follows a signal at a high level, with the high level signal making the subsequent low level signal inaudible for a certain time. The second processing unit 26 also identifies and eliminates the respective spectral range on the basis of this behaviour. The relationships relating to psychoacoustical masking are described, by way of example, in B. Zwicker, "Psychoakustik" [Psychoacoustics], Springer-Verlag 1982, pages 35 to 46 and 93 to 101. The second processing unit 26 controls the relationships mentioned therein.

A third processing unit 28 takes into account the spectral position of the individual spectral lines, with relatively high and low tones being attenuated to a greater extent than tones in the central range. This results in a loudness function so that high and low frequencies are emphasized when the drive level is low (corresponding to low levels). This corresponds to the method in which human hearing operates, which perceives high and low tones at high levels better than at low levels.

If the processing units 24, 26, 28 provide a limiter function, fourth and fifth processing units 30, 32 are provided, which can also be used for dynamic compression. The fourth processing unit 30 in this case detects one or more maxima in the input spectrum on the line 16 and attenuates these maxima by a specific amount, with the overall gain (that is, the amplitudes of all the signals) being emphasized at the same time. The amplitude peaks are thus reduced, while relatively low levels are correspondingly emphasized at the same time.

In contrast, the fifth processing unit 32 evaluates relatively small amplitudes, which are greater than a second limit value on a line 34 which corresponds to a specific relative maximum background noise level, but are below a third limit value on a line 36 which is higher than the second limit value on the line 34. The fourth and fifth processing units 30, 32 follow one another in a series connection thus resulting, overall, in the dynamic range being tailored "from the top and bottom", and then being further emphasized above the background noise level.

The processing units 24, 26, 28, 30, 32 are followed by a selection device 38 which selects the processing form (which is predetermined, for example, as a function of the amplitude distribution and spectral composition of the input spectrum on the line 16 determined by the respective one of the processing units 24, 26, 28, 30, 32), or combines a number of processing unit outputs with one another. The selection device 38 then uses this to produce the output spectrum on the line 20 which, in the present case, is likewise complex, but may also be purely real in certain applications.

The output spectrum on the line 20 is supplied to a second transformation device 40 which uses inverse fast Fourier transformation (IFFT) to produce a time domain signal, namely an output audio signal on a line 42.

In the present exemplary embodiment, the first transformation device 14 is preceded by an advanced initiation device 44, which supplies a system input audio signal on a line 46, delayed by a delay device 48, as the input audio signal 12 to the first transformation device 14. In this case, a control device 50 activates or deactivates the system 10 of FIG. 1 within the delay time, depending on whether or not the system input audio signal on the line 46 is greater than a specific limit value. If the specific amplitude limit value is exceeded, then the system 10 is activated during the time in which the system input audio signal on the line 46 is passing through the delay device 48, so that the system 10 is ready to operate when the increased amplitude value occurs at the output of the delay device 48.

In this case, the output audio signal on the line 42 is passed to a switching device 52 which is connected downstream from the second transformation device 40, and through to an output on a line 54 at the output of the system 10. Otherwise, the input audio signal on the line 12 is passed through the switching device 52 and to the audio system output on the line 54. The switching device 52 is controlled by a signal on a line 56 from the control device 50.

Figure 2A:
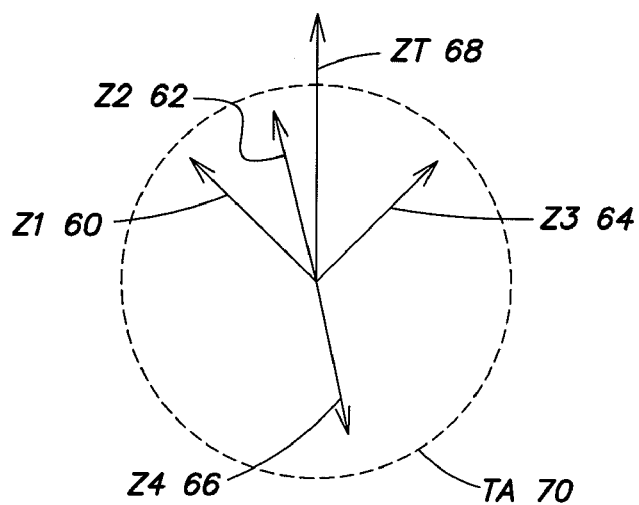
FIG. 2 illustrates a vector diagram in the spectral plane before and after limiting by the system of FIG. 1.
Figure 2B:
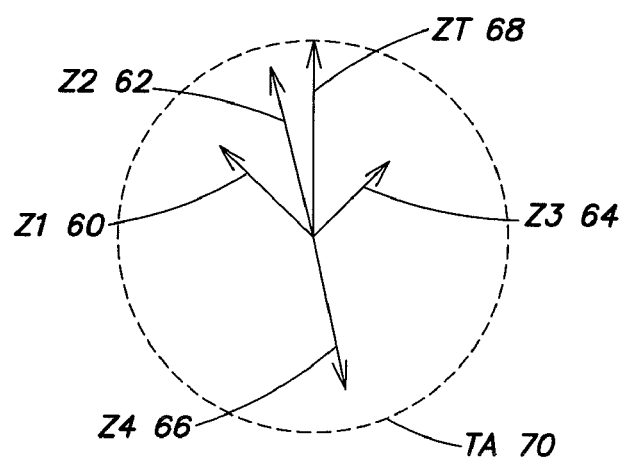

FIG. 2 illustrates the situation before (FIG. 2a) and after (FIG. 2b) limiting for four spectral lines Z1 60, Z2 62, Z3 64, and Z4 66 in two vector diagrams (FIGS. 2a, 2b), with the phase angle in particular being taken into account. Prior to limiting, it is assumed that all four spectral lines have the sample amplitude, with the spectral lines Z1 60 and Z4 66 having opposite phases. This results in an overall vector ZT 68 which is greater than a maximum permissible threshold amplitude value TA 70 (FIG. 2a). Limiting is carried out such that the overall phase does not change. The spectral lines Z2 62 and Z4 66 are not used for a reduction process, since they do not contribute to the overall vector ZT 68. In consequence, the magnitudes of the vectors for the spectral lines Z1 60 and Z3 64 are reduced to such an extent that the overall vector ZT 68 is no longer greater than the amplitude threshold value TA 70 (FIG. 2b).

Although the present invention has been shown and described with respect to several preferred embodiments thereof, various changes, omissions and additions to the form and detail thereof, may be made therein, without departing from the spirit and scope of the invention.

What is claimed is:

1. A system for reducing the dynamic range of an audio signal, comprising:
   a time delay that receives the audio signal and provides a time delayed audio signal;
   a control unit that receives the audio signal and provides a control signal indicative of whether or not the audio signal exceeds a limit;
   a first transformation device that transforms the time delayed audio signal from the time domain to the frequency domain and provides an input spectrum indicative thereof;
   a spectral processing device comprising a plurality of parallel arranged processing units that each receives the input spectrum and each applies a different dynamic compensation to the input spectrum to provide an associated one of a plurality of processor unit output signals to a selector unit that produces an output spectrum having a dynamic range that is reduced as compared to the input spectrum, where a first one of the plurality of parallel arranged processing units compares amplitude values of frequency components within the input spectrum and reduces the amplitude value of each frequency component whose value exceeds a first limit value, where a second one of the plurality of parallel arranged processing units removes frequency components that can not be perceived by a listener, and where a third one of the plurality of parallel arranged processing units performs loudness processing;
   a second transformation device, that receives and transforms the output spectrum from the frequency domain to the time domain and provides an output audio signal indicative thereof; and
   a switching unit that selectively outputs either the time delayed audio signal or the output audio signal depending upon the state of the control signal.

2. The system of claim 1, where the first transformation device transforms the input audio signal using a fast Fourier transformation, and where the second transformation device transforms the output spectrum using an inverse fast Fourier transformation.

3. The system of claim 1, where the spectral processing device produces the output spectrum by attenuating an amplitude of at least one spectral line within the input spectrum in at least one area of the input spectrum in which a characteristic of the at least one spectral line satisfies at least one predetermined condition.

4. The system of claim 3, where the characteristic of the at least one spectral line comprises an amplitude of the at least one spectral line being greater than a first limit value and in a certain spectral range.

5. The system of claim 3, where the at least one predetermined condition comprises the at least one spectral line having an amplitude and being within a spectral range that is psychoacoustically inaudible.

6. The system of claim 3, where the at least one predetermined condition comprises an amplitude of the at least one spectral line being one of a relatively maximum value and one of a maxima.

7. The system of claim 3, where the at least one predetermined condition comprises a certain position of the at least one spectral line within the input spectrum.

8. The system of claim 1, where the spectral processing device produces the output spectrum by emphasizing at least one spectral line within the input spectrum having an amplitude that is greater than a lower limit value and is less than a higher limit value.

9. The system of claim 1, where the input spectrum is complex.

10. A system for reducing the dynamic range of an audio signal, comprising:
    a time delay that receives the audio signal and provides a time delayed audio signal;
    a control unit that receives the audio signal and provides a control signal indicative of whether or not the audio signal exceeds a limit;
    means for transforming the time delayed audio signal from the time domain to the frequency domain to produce an input spectrum indicative thereof;
    first means for processing the input spectrum to produce a first output spectrum signal having a reduced dynamic range as compared to the input spectrum by comparing amplitude values of frequency components within the input spectrum and reducing the amplitude value of each frequency component whose value exceeds a first limit value;
    second means for processing the input spectrum to produce a second output spectrum signal having a reduced dynamic range as compared to the input spectrum, where the first and second means for processing are located in parallel signal paths and the second means for processing removes frequency components that can not be perceived by a listener;
    means, responsive to the first output spectrum signal and second output spectrum signal, for providing an output signal having a dynamic range that is reduced as compared to the input spectrum;
    means for transforming the output signal from the frequency domain to the time domain to produce an output audio signal indicative thereof;
    a switching unit that selectively outputs either the time delayed audio signal or the output audio signal depending upon the state of the control signal.

11. The system of claim 10, where the means for transforming the audio signal comprises a fast Fourier transform on the audio signal, and where the means for transforming the output signal comprises an inverse fast Fourier transform on the output signal.

12. The system of claim 10, where the first means for processing the input spectrum comprises means for attenuating an amplitude of at least one spectral line within the input spectrum when the amplitude of the at least one spectral line is greater than a predetermined limit.

13. The system of claim 10, where the second means for processing the input spectrum comprises means for removing at least one spectral line from within the input spectrum when the at least one spectral line represents a frequency that is inaudible.

14. The system of claim 10, where the second means for processing the input spectrum comprises means for attenuating an amplitude of at least one spectral line depending on the position of the at least one spectral line within the input spectrum.

15. The system of claim 10, where the first means for processing the input spectrum emphasizes at least one spectral line within the input spectrum having an amplitude that is between lower and higher limit values.

16. A system for reducing the dynamic range of an audio signal, comprising:

a time delay that receives the audio signal and provides a time delayed audio signal;

a control unit that receives the audio signal and provides a control signal indicative of whether or not the audio signal exceeds a limit;

a first transform that transforms the time delayed audio signal from the time domain to the frequency domain to produce an input spectrum indicative thereof;

a first processing unit that compares amplitude values of frequency components within the input spectrum and reduces the amplitude value of each frequency component whose value exceeds a first limit value and provides a first output spectrum to signal having a reduced dynamic range as compared to the input spectrum; and a second processing unit that processes the input spectrum to provide a second output spectrum signal having a reduced dynamic range as compared to the input spectrum by removing frequency components that can not be perceived by a listener, where the first and second processing units are located in parallel signal paths; and a selection unit that receives the first output spectrum signal and the second output spectrum signal, and provides an output signal having a dynamic range that is reduced as compared to the input spectrum;

a second transform unit for transforming the output signal from the frequency domain to the time domain to produce an output audio signal indicative thereof; and a switching unit that selectively outputs either the time delayed audio signal or the output audio signal depending upon the state of the control signal.

17. The system of claim 16, where the first processing unit reduces the dynamic range according to an amplitude of at least a first portion of the frequency representation of the audio signal.

18. The system of claim 17, where the second processing unit reduces the dynamic range according to an amplitude of at least a second portion of the frequency representation of the audio signal.

19. A system for reducing the dynamic range of an audio signal, comprising:

a time delay that receives the audio signal and provides a time delayed audio signal;

a control unit that receives the audio signal and provides a control signal indicative of whether or not the audio signal exceeds a limit;

a first transform that transforms the time delayed audio signal from the time domain to the frequency domain and provides an input spectrum indicative thereof;

a first processing unit that processes the input spectrum to provide a first output spectrum signal having a reduced dynamic range as compared to the input spectrum, by comparing amplitude values of frequency components within the input spectrum and reduces the amplitude value of each frequency component whose value exceeds a first limit value; and a second processing unit that processes the input spectrum to provide a second output spectrum signal having a reduced dynamic range as compared to the input spectrum by removing frequency components that can not be perceive by a listener, where the first and second processing units are located in parallel signal paths; and selection logic that receives and selects from the first output spectrum signal and the second output spectrum signal, and provides an output signal having a dynamic range that is reduced as compared to the input spectrum;

a second transform for transforming the output signal from the frequency domain to the time domain to produce an output audio signal indicative thereof; and a switching unit that selectively outputs either the time delayed audio signal or the output audio signal depending upon the state of the control signal.

20. The system of claim 1, where the selector unit comprises a mixer.

21. The system of claim 10, where the means for providing comprises a selector unit.

22. The system of claim 16, where the selection unit comprises a mixer that receives and mixes the first and second output spectrum signals to provide the output signal.

* * * * *